(12) United States Patent
Lu et al.

(10) Patent No.: US 7,172,390 B2
(45) Date of Patent: Feb. 6, 2007

(54) HOT SWAP FAN CONNECTING DEVICE THEREOF

(75) Inventors: William Lu, Taoyuan County (TW); Ying-Chi Chen, Taoyuan County (TW); Te-Tsai Chuang, Taoyuan County (TW); Ming-Shi Tsai, Taoyuan County (TW); Kuo-Cheng Lin, Taoyuan County (TW)

(73) Assignee: Delta Electronics, Inc., Taoyuan County (TW)

( * ) Notice: Subject to any disclaimer, the term of this patent is extended or adjusted under 35 U.S.C. 154(b) by 155 days.

(21) Appl. No.: 10/962,458

(22) Filed: Oct. 13, 2004

(65) Prior Publication Data

US 2005/0105271 A1   May 19, 2005

(30) Foreign Application Priority Data

Nov. 14, 2003   (TW) ............................... 92132061 A

(51) Int. Cl.
*F04D 29/64*   (2006.01)
(52) U.S. Cl. .................................... 415/213.1; 415/220
(58) Field of Classification Search ............... 415/108, 415/126, 220, 213.1; 361/695, 697; 417/423.14, 417/423.15
See application file for complete search history.

(56) References Cited

U.S. PATENT DOCUMENTS

| | | | |
|---|---|---|---|
| 6,236,564 B1 * | 5/2001 | Fan | 361/695 |
| 6,493,225 B2 * | 12/2002 | Chuang et al. | 361/695 |
| 6,592,327 B2 * | 7/2003 | Chen et al. | 415/213.1 |

FOREIGN PATENT DOCUMENTS

| | | |
|---|---|---|
| CN | 1425965 | 6/2003 |
| DE | 10052708 | 7/2002 |
| TW | 472917 | 1/2002 |

* cited by examiner

*Primary Examiner*—Edward K. Look
*Assistant Examiner*—Dwayne J White
(74) *Attorney, Agent, or Firm*—Birch, Stewart, Kolasch & Birch, LLP

(57) ABSTRACT

A connecting device of a hot swap fan module comprises at least one terminal and a casing. The at least one terminal is electrically connected to the fan so that, when the fan is mounted in a system, electrical connection is formed between the fan and the system. The connecting device further comprises at least one LED (light emitting diode) which is electrically connected to the fan or the at least one terminal for indicating the operating state of the fan, and at least one cover plate protruded from at least one edge of the casing so as to form the whole casing into an L or U-shaped structure. The casing is closely attached to one side face of the fan housing when the casing is assembled to the fan. The casing also has a recess for receiving those lead wires electrically connecting the terminals, the fan, and the LED.

18 Claims, 5 Drawing Sheets

HOT SWAP FAN CONNECTING DEVICE THEREOF

This Non-provisional application claims priority under 35 U.S.C. § 119(a) on Patent Application No(s). 092132061 filed in Taiwan, Republic of China on Nov. 14, 2003, the entire contents of which are hereby incorporated by reference.

BACKGROUND OF THE INVENTION

1. Field of the Invention

The present invention relates to a fan and its connecting device, and particularly, to a hot swap fan module including a hot swap fan and its connecting device.

2. Description of the Related Art

Electronic products per se, during operation, will generate heat which, in turn, raises the environmental temperature in the whole system, and thus causes reduction in the stability of the system or even failure of the system. Consequently, heat dissipation device must be used so that the system may operate at a stable environmental temperature. The most commonly used heat dissipation device is heat dissipation fan. Besides, for avoiding stoppage in the operation of the whole system so as to meet a non-stop operation requirement upon replacing a failed heat dissipation fan, a heat dissipation fan capable of hot swap has been developed.

Taiwanese Patent Publication No. 472917 disclosed a system (a server) of a drawer type hot swap fan wherein a hot swap fan module, as shown in FIG. 1, includes a supporting frame 11, a hot swap fan 12, and a plug-in circuit board 13. The hot swap fan 12 is mounted to the supporting frame 11 by plastic rivets 14, and the plug-in circuit board 13 is fastened to the supporting frame 11 by screws 15. The supporting frame 11 includes stainless leaf spring 16 for fixing the supporting frame 11 to the system (not shown). Between the hot swap fan 12 and a hot swap circuit board (not shown) mounted on the system, hot swap may be conducted by use of the plug-in circuit board 13.

According to the above conventional hot swap fan structure, since the hot swap fan 12 is completely wrapped by the supporting frame 11, and the plug-in circuit board 13 projects outwards from the supporting frame 11 for connecting the system, the size of the whole hot swap fan module is larger than that of the fan per se, and thus its volume cannot be effectively reduced. When space restriction is required on the system side, this requirement cannot be met. Besides, since the above conventional hot swap fan structure includes many comprising members, it will not only cause increment in the managing cost and the number of assembling steps of its comprising members, but also raises the risk of occurrence of defective products.

Summing up the above, it still remains unsolved how to effectively reduce the overall volume of a hot swap fan module and simplify the comprising members and the assembling process thereof.

SUMMARY OF THE INVENTION

In view of the above, one object of the present invention is to provide a hot swap fan module (including a hot swap fan and its connecting device) capable of effectively reducing the overall volume of the hot swap fan module so as to meet the space restriction requirement from the system side.

Another object of the present invention is to provide a hot swap fan module (including a hot swap fan and its connecting device) capable of simplifying the comprising members and the assembling process of the hot swap fan module.

For realizing the above objects, a connecting device in a hot swap fan module according to the present invention includes at least one terminal and a casing. The at least one terminal is electrically connected to the fan so that, when the fan is mounted in a system, electrical connection is formed between the fan and the system. The casing is closely attached to one side face of the fan housing when the casing is assembled to the fan. The connecting device further comprises at least one cover plate protruded from at least one edge of the casing so as to form the whole casing into an L or U-shaped structure. The casing also has a recess for receiving those lead wires electrically connecting the terminals and the fan. In addition, the connecting device of a hot swap fan according to the present invention further includes at least one LED (light emitting diode) electrically connected to the fan or the at least one terminal for indicating the operating state of the fan.

A hot swap fan module according to the present invention includes a fan and a connecting device, wherein the fan includes a housing having at least one hole or protuberance. However, this hot swap fan module is the same as conventional fans in its remaining functions and way of operation. As for the connecting device of the fan, it is assembled to the fan so that the fan may be hot swapped in a system, as described above.

According to the present invention, since the casing of the connecting device is closely attached to one side face of the fan when the casing is assembled to the fan, it is possible to effectively reduce the overall volume of the hot swap fan module so as to meet the requirement of space restriction from the system side. Besides, since the connecting device of the hot swap fan includes only a casing and terminals, it is possible to greatly decrease the number of the comprising members of the hot swap fan module and simplify the assembling process thereof.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the following detailed description and the accompanying drawings, which are given by way of illustration only, and thus are not limitative of the present invention, and where.

DETAILED DESCRIPTION OF THE PREFERRED EMBODIMENTS

A hot swap fan and its connecting device according to the preferred embodiments of the present invention will now be described in detail with reference to the accompanying drawings.

Figure 1B:
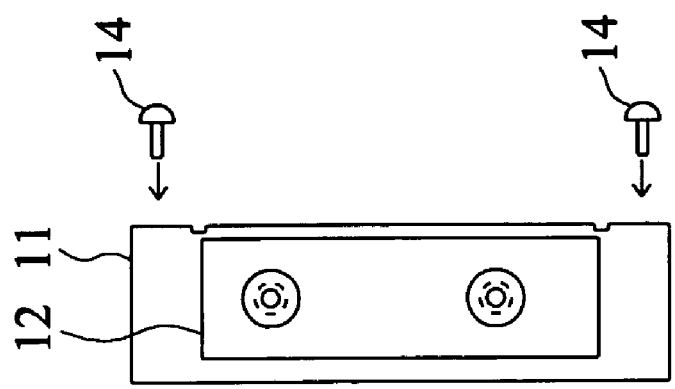
FIG. 1B shows a side view of the same conventional hot swap fan module.
Figure 1A:
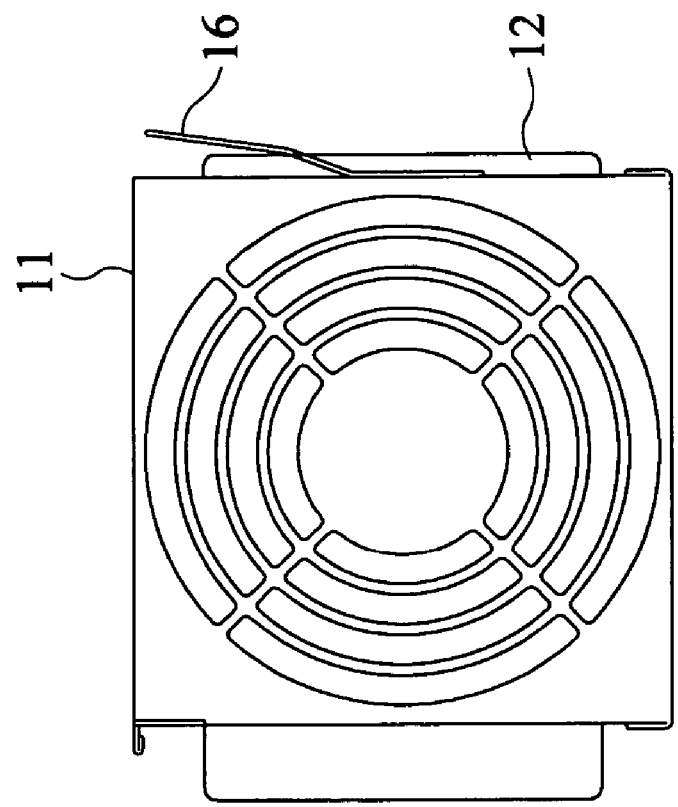
FIG. 1A shows a front view of a conventional hot swap fan module.
Figure 2:
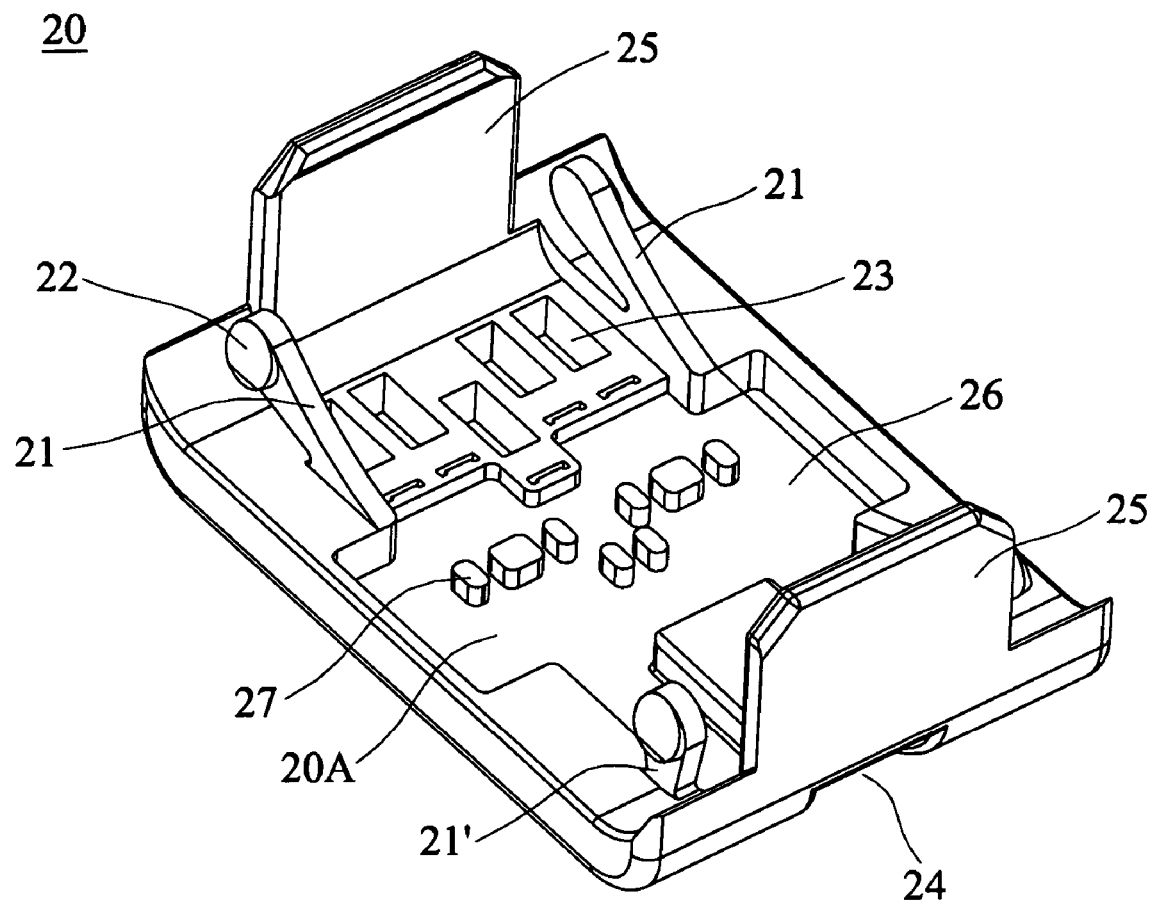
FIG. 2 shows a perspective view of a connecting device in a hot swap fan module according to a preferred embodiment of the present invention, with the terminals of the connecting device being omitted.
Figure 3:
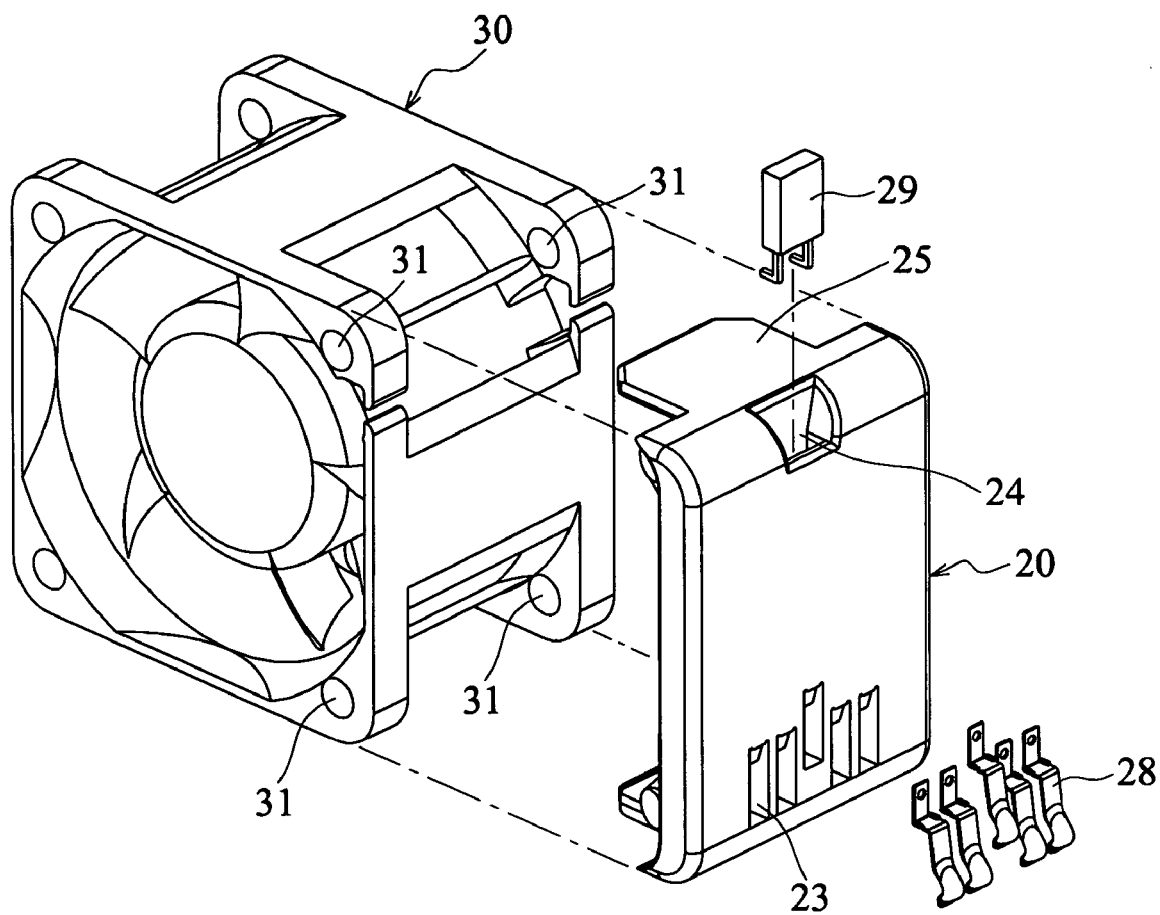
FIG. 3 shows an exploded perspective view of a hot swap fan module according to a preferred embodiment of the present invention.
Figure 4:
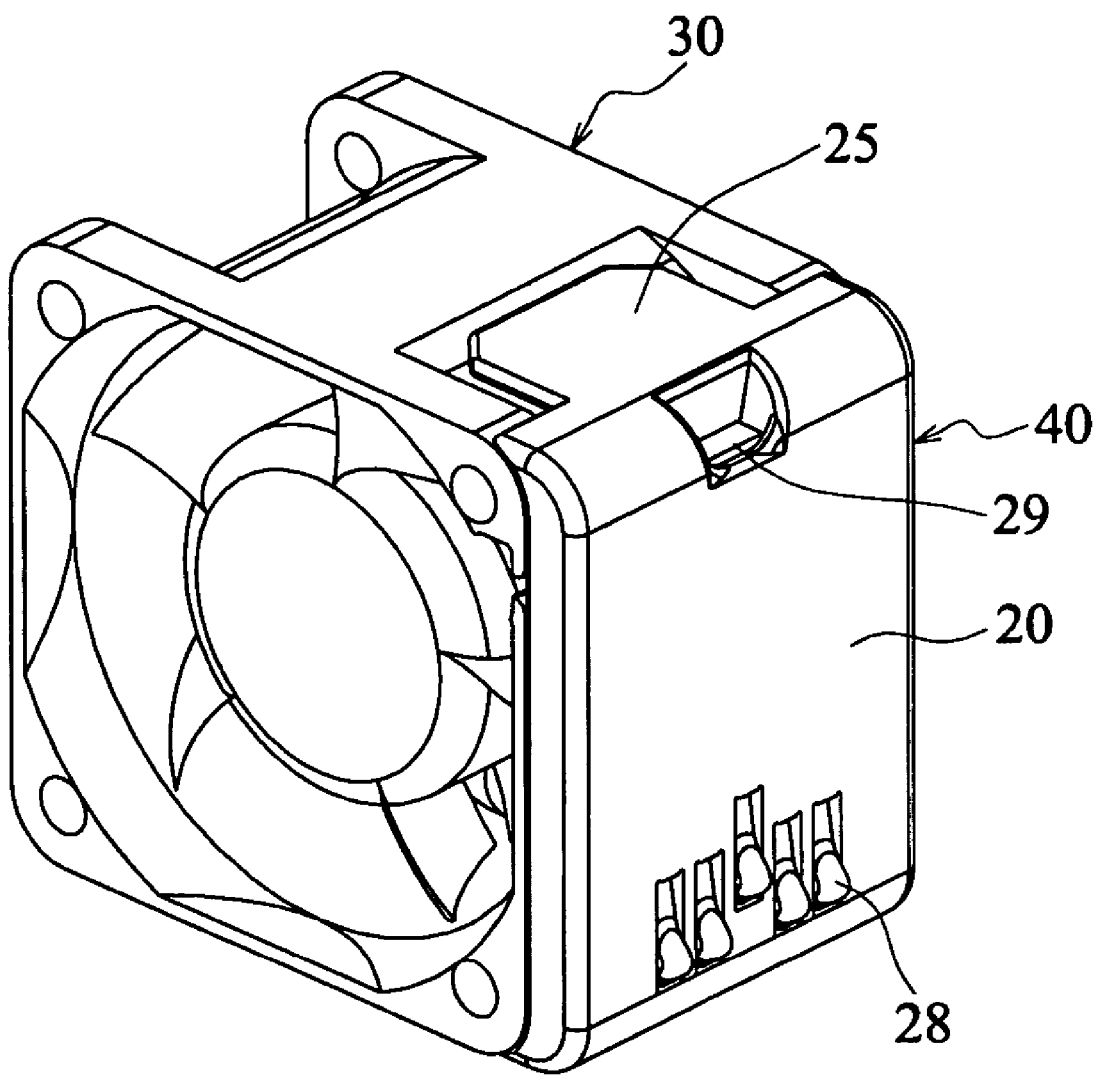
FIG. 4 shows an assembled perspective view of the hot swap fan module shown in FIG. 3.

Referring to FIG. 2 and FIG. 3, according to the first preferred embodiment of the present invention, a connecting device of a hot swap fan includes a casing 20 and at least one terminal 28. The casing 20 is of an approximately U-shape including a substantially flat body portion 20A and two cover plates 25 each of which extends perpendicularly from one edge of the substantially flat body portion 20A. Each cover plate 25 engages with one side face of the fan 30 so as to shield the gap between the casing 20 and the fan 30 when the casing 20 is assembled to the fan 30 as shown in FIG. 4. Alternatively, the casing 20 may be of an approximately L-shape including only one cover plate 25. The cover plate(s) 25 may be integrally formed with the body portion 20A as shown in FIG. 2 or may be separate member(s) fastened to the body portion 20A by any possible fastening means. The body portion 20A has a first surface facing the fan 30 in an assembled state, and a second surface opposite to the first surface. The first surface includes at least one plate spring 21. Each plate spring 21 is connected to the body portion 20A at one end, and is provided with a protrusion 22 at the other end. The protrusion 22 includes an inclined surface for guiding the protrusion 22 to correctly engage with a hole 31 provided on the housing of the fan 30, when the casing 20 is assembled to the fan 30, so as to avoid failure in the engagement between the casing 20 and the fan 30.

The plate spring may extend in a direction intersecting the first surface of the body portion 20A at an angle smaller than 90° as shown by the plate spring 21 in FIG. 2, or perpendicular to the first surface as shown by the plate spring 21' in FIG. 2. The plate spring 21 or 21' may be integrally formed with the body portion 20A or may be separate member(s) fastened to the body portion 20A by any possible fastening means. Since the plate spring 21 is longer than the plate spring 21' in whole length, the former has better resilience than the latter. However, among the plural plate springs included in the casing, some ones may adopt the design of shorter plate spring 21' so as not to hinder the necessary lead wire layout of the fan 30.

The body portion 20A further includes terminal receiving holes 23 for receiving the terminals 28 therein. Each terminal 28 includes a first end, near the fan 30 side, which is electrically connected via lead wires (not shown) to the fan 30, and a second end exposed to the second surface of the body portion 20A. The terminals 28 enable the electrical connection between the fan 30 and a system to which the fan 30 is assembled.

The body portion 20A further includes LED (light emitting diode) receiving hole 24 for receiving the LED 29 therein. The light emitting side of the LED 29 faces the second surface of the body portion 20A for indicating the operation state of the fan 30. Another side of the LED 29 faces the first surface of the body portion 20A so as to form electrical connection with the fan 20 or the terminals 28. Namely, the light emitting state of the LED 29 is controlled via the signal coming from the fan 30 or the system in which the fan is assembled.

The body portion 20A, on its first surface side, further includes a recess 26 for receiving those lead wires (not shown in the figure) electrically connecting the fan 30, the terminals 28 and the LED 29. A plurality of projections 27 may be provided in the recess 26 so as to form plural wire collection grooves for facilitating the collection of lead wires.

Now referring to FIG. 4, a hot swap fan module according to the present invention includes a fan 30 and its connecting device 40. The fan 30 includes a housing having at least one hole 31. However, this hot swap fan module is the same as conventional fans in its remaining functions and way of operation, and thus further description regarding these is omitted. Besides, the feature in the construction of the connecting device 40 and the way of assembling the connecting device 40 to the fan 30 has been described above in detail.

According to the present invention, the fan 30 is covered on its only one side face by the casing 20, rather than being completely wrapped by a supporting frame as in the situation of a conventional hot swap fan module. Thus, the volume of a hot swap fan module according to the present invention can be effectively reduced so as to meet a space restriction requirement from the system side. Besides, since the casing 20 according to the present invention is integrally formed with plate springs 21, the casing 20 may be fitted to a fan 30 of standard specification merely by pressing the plate springs 21 formed with protrusions 22. Hence, compared with prior art, those fastening members such as rivets 14 or screws 15 are no more necessary, thus enabling a great reduction in the managing cost of fastening members and a great simplification in the assembling process thereof.

Figure 5:
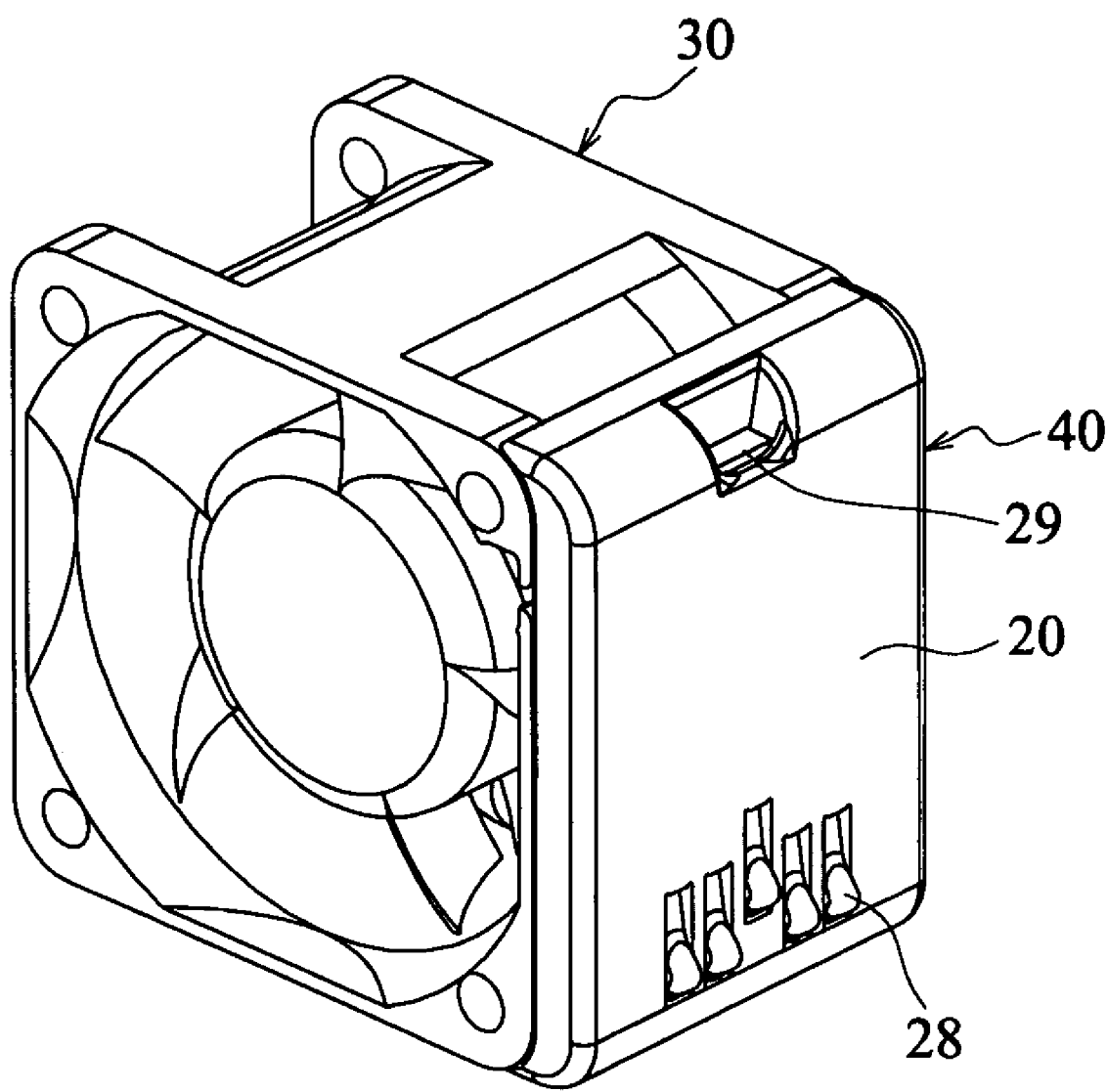
FIG. 5 shows an assembled perspective view of a hot swap fan module according to another preferred embodiment of the present invention.

In the embodiment described above, the terminals are provided near the bottom portion of the right side face of the hot swap fan module (see FIG. 3 or 4), but the terminals may also be provided on the left side, or upper or lower side of the hot swap fan module in accordance with the need of the system. Besides, a plurality of LEDs may be provided for indicating various operating states of the fan. In addition, the terminals, plate springs, and LEDs may also be provided on the cover plates according to the need of the system. For example, the terminals may be provided on the second surface of the casing, while the LEDs on the cover plate. Alternatively, the terminals and the LEDs may be provided on the two opposed cover plates, respectively. Instead of the engaging mechanism of the casing and the fan as described above, the hole may also be formed on the plate spring and the protrusion on the housing of the fan for engagement purpose. Further, fastening members such as rivets or screws may also be used for fastening the casing and the fan pursuant to the special requirement from the system side. Though the casing is described to be an integral member in the above embodiment, the casing may include at least two separate sections assembled to the fan, respectively, for ease of maintenance. Alternatively, the casing may be of a flat shape with no cover plate, and be directly assembled to the fan at its flat body as shown in FIG. 5.

The present invention may be embodied in other specific forms without departing from the spirit or essential characteristics thereof. The foregoing embodiments are therefore to be considered in all respects as illustrative and not restrictive, the scope of the invention being indicated by the appended claims rather than by the foregoing description and all changes which come within the meanings and range of equivalency of the claims are therefore intended to be embraced therein.

The invention claimed is:

1. A connecting device of a hot swap fan, said fan comprising a housing having at least one side face and at least one hole or protuberance, said connecting device being assembled to said fan so that said fan may be hot swapped in a system, said connecting device comprising:
at least one terminal electrically connected to said fan so that, when said fan is mounted to the system, an electrical connection is formed between said fan and said system; and
a casing having a first surface covering said side face of said fan housing when said casing is assembled to said fan, a second surface opposite to said first surface, and a recess provided on said first surface for receiving at least one lead wire electrically connecting said terminal and said fan.

2. The connecting device as recited in claim 1, wherein said casing has a substantially flat shape.

3. The connecting device as recited in claim 1, further comprising at least one cover plate protruded from at least one edge of said casing so as to form said casing into an L or U-shaped structure.

4. The connecting device as recited in claim 3, further comprising at least one LED (light emitting diode) electrically connected to said fan or said terminal for indicating the operating states of said fan, said LED and said terminal being mounted on said second surface or said cover plate.

5. The connecting device as recited in claim 4, further comprising at least one plate spring having one end connected to said first surface or said cover plate, for fixing said casing to said fan.

6. The connecting device as recited in claim 5, wherein said plate spring has another end provided with a protrusion or an opening, for engaging with said hole or said protuberance of said fan housing.

7. The connecting device as recited in claim 6, wherein said protrusion or said protuberance comprises an inclined surface for guiding said protrusion or said protuberance to correctly engage with said hole or said opening.

8. The connecting device as recited in claim 5, wherein said at least one plate spring extends in a direction intersecting said first surface of said casing at an angle smaller than or equal to 90°.

9. The connecting device as recited in claim 4, wherein said recess is provided with at least one projection for facilitating the collection of the lead wires.

10. The connecting device as recited in claim 4, wherein said casing is an integral member.

11. A hot swap fan module comprising:
a fan comprising a housing having at least one side face and at least one hole or protuberance, and
a connecting device assembled to said fan so that said fan may be hot swapped in a system, said connecting device comprising: at least one terminal electrically connected to said fan so that, when said fan is mounted in a system, an electrical connection is formed between said fan and said system; and a casing having a first surface covering said side face of said fan housing when said casing is assembled to said fan, a second surface opposite to said first surface, and
a recess provided on said first surface for receiving at least one lead wire electrically connecting said terminal and said fan.

12. The hot swap fan module as recited in claim 11, further comprising at least one cover plate protruded from at least one edge of said casing so as to form said casing into an L or U-shaped structure.

13. The hot swap fan module as recited in claim 12, comprising at least one LED (light emitting diode) electrically connected to said fan or said terminal for indicating the operating states of said fan, said LED and said terminal being mounted on said second surface or said cover plate.

14. The hot swap fan module as recited in claim 11, further comprising at least one plate spring having one end connected to said first surface or said cover plate, for fixing said casing to said fan.

15. The hot swap fan module as recited in claim 14, wherein said plate spring has another end provided with a protrusion or an opening, for engaging with said hole or said protuberance of said fan housing.

16. The hot swap fan module as recited in claim 15, wherein said protrusion or said protuberance comprises an inclined surface for guiding said protrusion or said protuberance to correctly engage with said hole or said opening.

17. The hot swap fan module as recited in claim 14, wherein said at least one plate spring extends in a direction intersecting said first surface of said casing at an angle smaller than or equal to 90°.

18. The hot swap fan module as recited in claim 11, wherein said recess is provided with at least one projection for facilitating the collection of the lead wires.

* * * * *